United States Patent

Wen

[11] Patent Number: 5,377,076
[45] Date of Patent: Dec. 27, 1994

[54] WATER PROOF STRUCTURE FOR HOUSING AN OUTDOOR SENSOR DEVICE

[76] Inventor: Hung-Sheng Wen, 3F., No. 5, Lane 14 Yung Kang Street, Taipei City, Taiwan, Prov. of China, 106

[21] Appl. No.: 165,819

[22] Filed: Dec. 14, 1993

[51] Int. Cl.⁵ .............................................. H05K 5/00
[52] U.S. Cl. .................................. 361/679; 174/52.3; 359/871; 362/267; 361/730; 361/732
[58] Field of Search ............... 174/52.3; 340/567, 693; 362/158, 267, 371, 427, 802; 361/659, 665–666, 67.9, 688, 672, 720, 730; 359/871

[56] References Cited

U.S. PATENT DOCUMENTS

| | | | |
|---|---|---|---|
| 4,527,224 | 7/1985 | Sangiano et al. | 362/371 |
| 4,625,259 | 11/1986 | Krechmer et al. | 361/610 |
| 4,651,144 | 3/1987 | Pagano | 340/693 |
| 5,103,346 | 4/1992 | Chang | 340/567 |

*Primary Examiner*—Gregory D. Thompson
*Attorney, Agent, or Firm*—Bacon & Thomas

[57] ABSTRACT

A housing for an outdoor sensor device may be pivotally connected to a cell seat for permitting the housing to be rotatably positioned and directed for detection. A rotatable arm for pivotally connecting the housing to the cell seat receives electric wires from the seat for connection to the sensor device enclosed within a sealed compartment of the housing. The components of the housing and rotatable arm are provided with waterproof seal means to prevent water from damaging the sensor device.

4 Claims, 4 Drawing Sheets

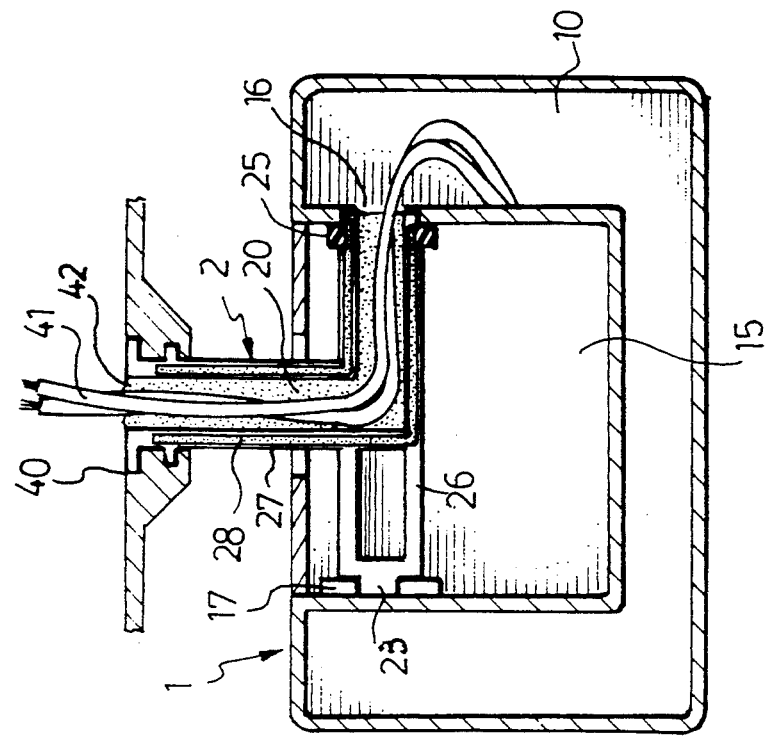
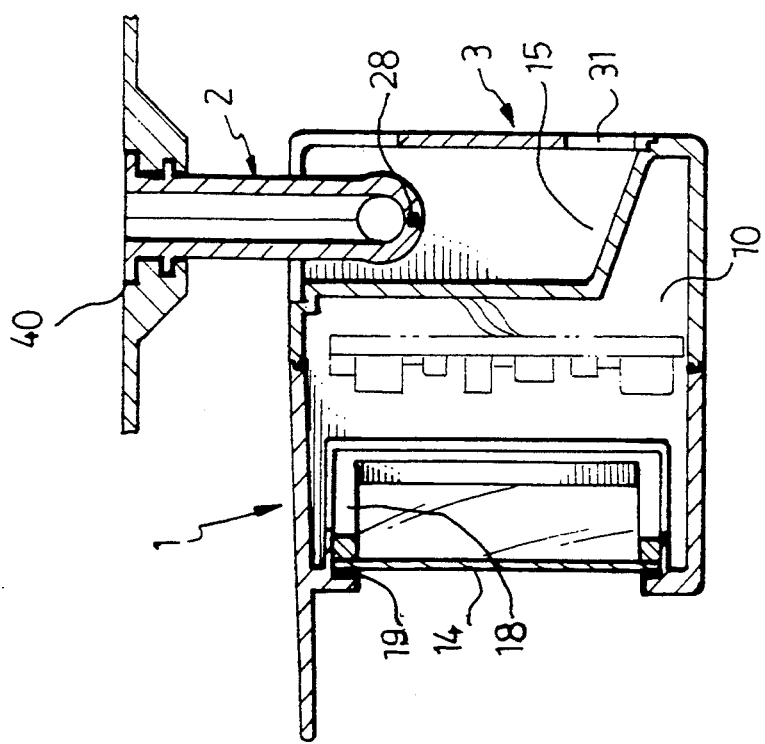

WATER PROOF STRUCTURE FOR HOUSING AN OUTDOOR SENSOR DEVICE

FIELD OF THE INVENTION

The invention relates to a water-proof structure for housing an outdoor sensor device and, in particular, to a housing for a sensor which can be rotatably positioned and directed for detection. The combination of a rotatable arm and the housing of the sensor and the design of a water-proof means in each conjunction portion can keep the detecting electronic elements in the housing any such that the sensor can effectively perform the function of detection.

BACKGROUND OF THE INVENTION

The sensor mentioned above relates to a photosensor, and the so-called water-proof structure is mainly designed for an outdoor sensor device. The conventional outdoor sensing and lighting device, as shown in FIG. 1, includes a lamp (6), a cell seat (4), an AC electric wire (5), a sensor housing (1) and a rotatable joint (2). Said lighting device is powered through solar energy or AC electric wire (5), and by means of the rotatable sensor (1). If people or a foreign body enters into its detecting area, the lamp (6) will be turned on to light up a specific area for the motion of people or for guarding against burglary, and the lamp (6) will be turned off after the people leave the detecting area. Such power-saving and practical sensing and lighting device is usually used in a staircase, aisle, yard or plaza.

In the aforesaid lighting device, the detecting elements and circuit in the housing of the sensor are all sensitive elements which are liable to be damaged due to humidity which will cause the short-circuit or oxidation of the elements. Since such conventional sensing and lighting device is placed outdoors, it is usually covered and eroded by rain, dew, frost or snow, and the seam of the housing, the wire hole, and rotatable joint are all easily intruded by water which will leak into the housing along the wire and flow onto the circuit board of the sensor. In other words, the conventional structure for the housing of the sensor can not prevent the intrusion of water.

SUMMARY OF THE INVENTION

For overcoming the aforesaid drawback of the conventional sensing and lighting device, the invention provides a water-proof structure for housing a sensor device which can not only maintain the normal rotatably positioning function but also maintain the dryness of the sensor in order to prevent humidity from damaging the detecting circuit.

The main purpose of the invention is to provide a water-proof structure for the housing of an outdoor sensor device, including a housing which can be rotatably positioned while possessing good water-proof seal, and by means of the combination of water-proof ring, water-proof glue and an inverted T-shaped rotatable arm having a single-hole for insertion of an electric wire, an effective outdoor water-proof structure for the housing of a sensor device can be obtained to maintain the dryness of the sensor in order to perform its normal function of detection.

BRIEF DESCRIPTION OF THE INVENTION

A complete understanding of the invention may be obtained from its following detailed description when read in conjunction with the appended drawings, in which:

FIG. 4 is a sectional view of the invention along line 4—4 of FIG. 2; and

FIG. 5 is a sectional view of the invention along line 5—5 of FIG. 2.

DETAILED DESCRIPTION OF THE DRAWING

Figure 1:
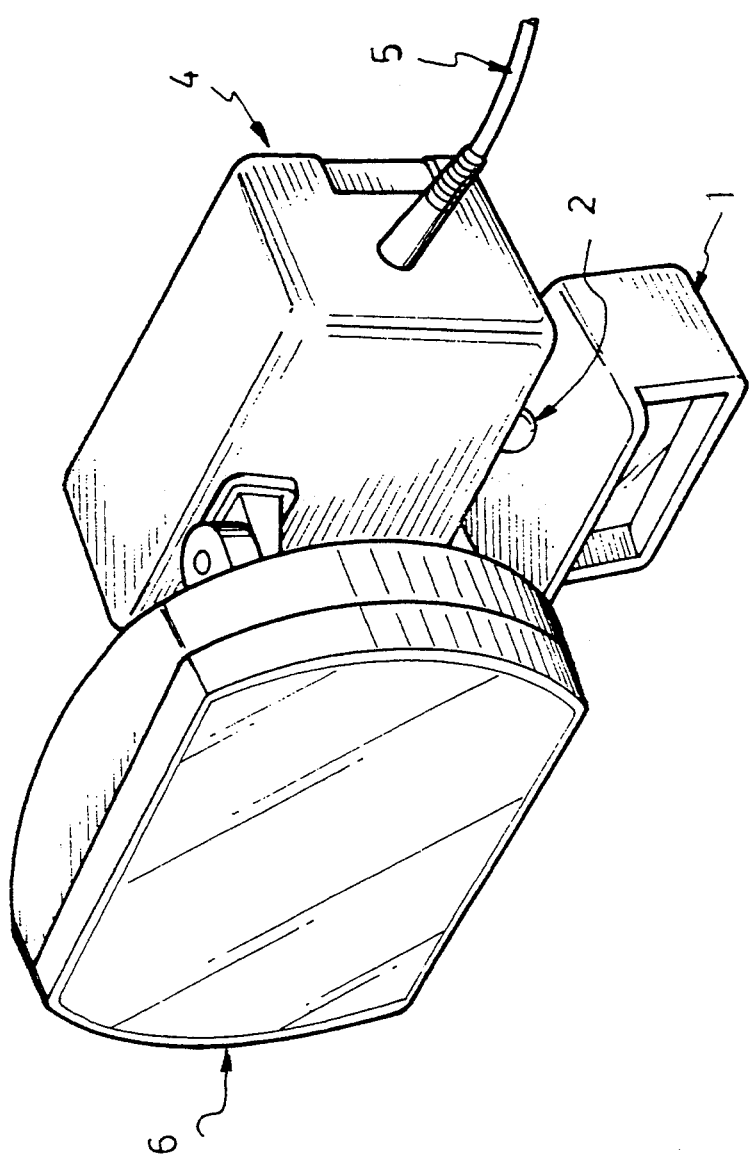
FIG. 1 is a perspective view of a conventional outdoor sensing and lighting device.

As seen in FIG. 1, there is shown a conventional outdoor sensing and lighting device wherein a housing (1) is used to receive a sensor which can be rotatably positioned. Said device can detect if there is a foreign body entering into a detecting area and can turn on the lamp (6). Since the normal function of the sensor will be affected due to the rain, dew, and snow leaking in through the housing and the rotatable portion of the housing (1) when in bad weather, the present invention provides a novel and improved rotatable and water-proof structure for the housing.

Figure 2:
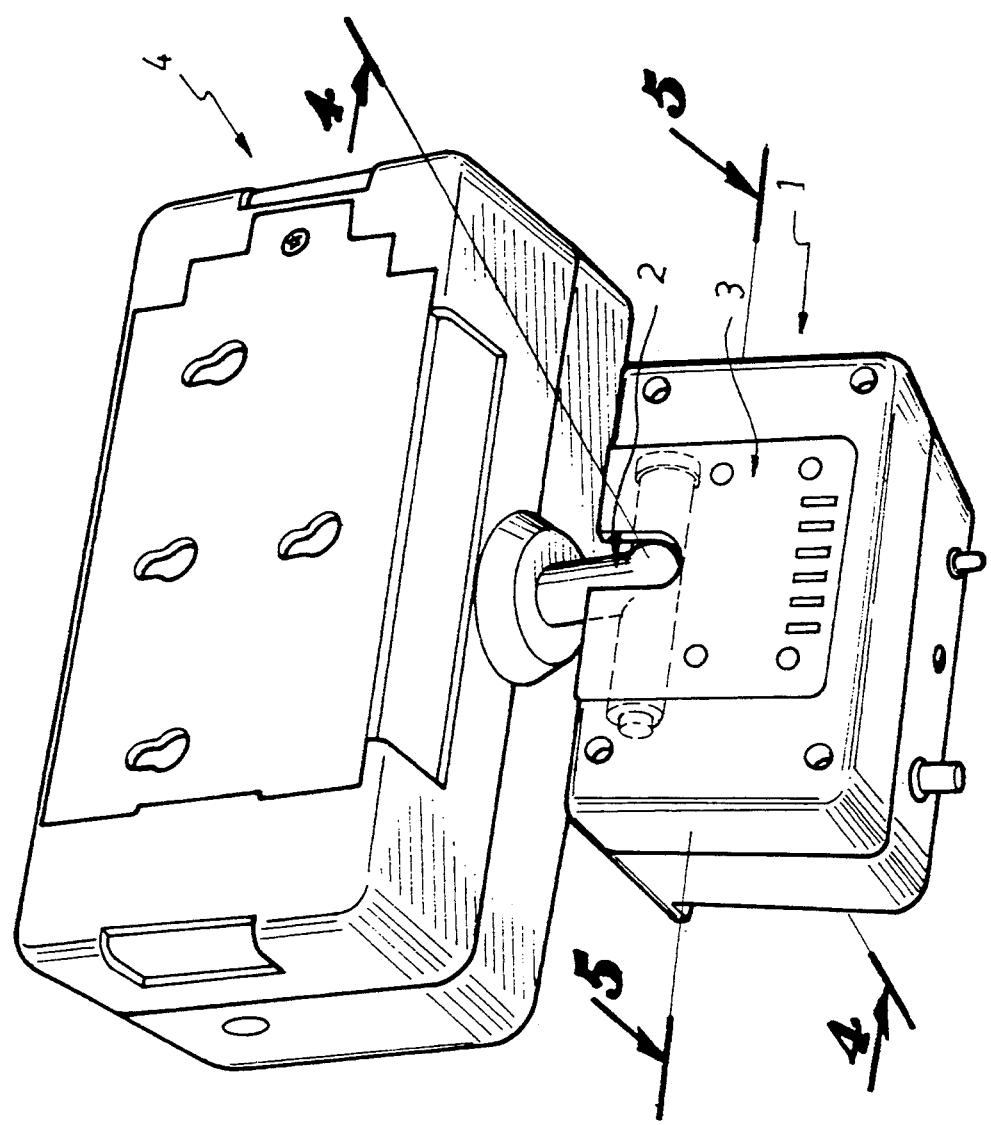
FIG. 2 is a perspective view of the housing of the invention connected with a power supply device.

With reference to FIG. 2, there is a perspective view showing a housing (1) and a rotatable arm (2) of the invention being connected to the bottom of a cell seat (4). Said rotatable arm (2) is an inverted T type tube including an upper upright tube portion (27) being pivotally connected to the cell seat (4) and a lower transverse tube portion (26) being pivotally connected to the housing (1) at two ends thereof and being covered by a rear cover plate (3) such that the housing (1) can be arbitrarily rotated within a certain angle and position.

Figure 3:
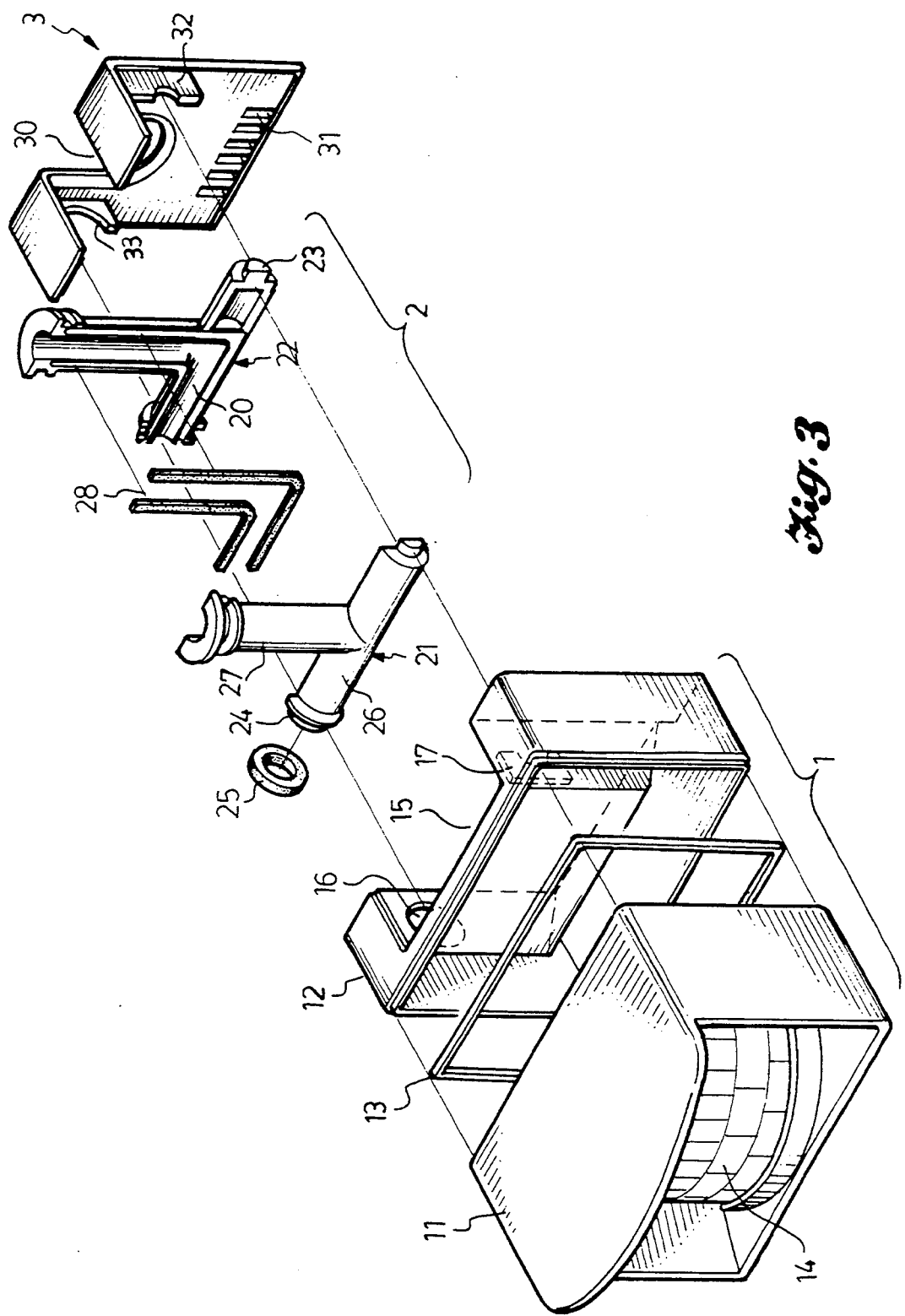
FIG. 3 is an exploded view of the water-proof structure of the invention.

As seen in FIG. 3, there is shown an exploded view of the structure of the invention. The housing (1) includes a front cover (11), a rear cover (13) and a water-proof plastic ring (12) provided therebetween. The front face of the front cover (2) is provided with an electric mask (14) having diaphaneity. The back side of the rear cover (12) is provided with a recess (15) of which one side wall has a wire hole (16) and another side wall has an element (17) having a semi-circular hole. The rotatable arm (2) includes a front half portion (21) and a rear half portion (22). An L-shaped channel (20) extends from the upper end of the upright tube portion (27) through the upright tube portion (27) to an end of the transverse tube portion (26). Two L-shaped water-proof plastic strips (28) are respectively inserted into the two outer sides of the L-shaped channel (20) formed between the front half portion and the rear half portion. The upright tube portion (27) of the rotatable arm (2) has a flange portion at the upper end thereof. An end of the transverse tube portion (26) is provided with a recessed circular groove (24) for receiving a water-proof washer (25) and another end of the transverse tube portion (26) is provided with a projecting pivot axis (23). The water-proof washer (25) of the rotatable arm abuts against the outside of the wire hole (16) and the pivot axis (23) is pivotally connected to the element (17) having the semi-circular hole. The rear cover plate (3) is engaged with the recess (15) and has elements (32, 33) each having a semi-circular hole which can be engaged with the two ends of said rotatable arm (2) such that the housing (1) can be rotated with respect to the transverse tube portion (26). The rear cover plate (3) is substantially an inverted L-shaped thin plate which is provided with a plurality of drainage holes (31).

As shown in FIGS. 4 and 5, for ensuring that the closed space (10) is in an air-tight condition, the waterproof plastic ring (13) is used to fill the seam between the front cover (11) and the rear cover (12), and the mask (14) is adhered to the inner edge of the window of the front cover by means of a double sided adhesive tape (19) stationary tape) while the periphery of the inner side of the the mask (14) is engaged with an engagement frame (18) in a press fit relationship. The electric wire hole (16) is used for the insertion of electric wires and the rotatable arm (2) and the water-proof washer (25) closely abuts against the outer edge of the wire hole (16) such that the closed space (10) can be maintained in an air-tight condition in order to prevent the detecting elements in the closed space (10) from being damaged by the invasion of water.

Further, since the rotatable arm (2) is used to suspend the housing (1) and permit the housing to be rotatable and positioned within a certain angle and let the wires (41) be inserted into the closed space (10) of the housing (1) through the L-shaped channel (20) in order to supply power to the detecting elements, preventing water from leaking into the closed space along the rotatable arm (2) or the wires (41), requires a good water-proof means. As shown in FIGS. 4 and 5, two flanges at the upper end of the upright tube portion (27) are pivotally connected with the hole (40) provided in the cell seat (4) while two L-shaped water-proof plastic strips (28) are provided between the front half portion (21) and the rear half portion (22) such that water can not leak in through the rotatable arm (2). As to the interior of the L-shaped channel (20) through which the electric wires (41) pass, after the electric wires (41) pass through the interior of the L-shaped channel, then said interior is filled with a hot-melt adhesive (42) to prevent water from linking into the detecting elements from the upper end of the electric wires (41).

As shown in FIG. 4, the lower portion of the recess (15) is slanted; by cooperating with the drainage holes (31) of the rear cover plate (3), rain, snow or frost falling into said recess (15) can be discharged and will not accumulate therein.

The characteristic of the invention resides in utilizing the plastic ring (13), double sided adhesive tape (19), water-proof hot-melt adhesive etc. as water-proof means in each seam, and in particular, in the design of a single wire hole (16) for the insertion of the electric wires (41) into the closed space (10) to minimize the number of the holes that can be used by the closed space (10) to communicate with the external environment, and by using the water-proof washer (25) as sealing means for sealing the wire hole (16) and the friction of the water-proof washer (25) which can be used to maintain the positioning of the housing (11) after being rotated, the closed space (10) can be effectively maintained in an air-tight condition to prevent water from leaking into the closed space (10) to damage the detecting elements such that the normal function of the device can be maintained and the useful life of the device can also be extended.

I claim:

1. A waterproof structure for housing an outdoor sensor device comprising:
    a) a housing and a rotatable arm for pivotally suspending the housing from a fixed object and permitting the housing to be rotatably positioned and directed;
    b) the housing including a closed space therein for receiving a sensor device, a first open side covered by a diaphanous mask, means for sealingly securing the mask to the first open side, and a second side including a recess defined by two sidewalls, an electric wire hole formed in one sidewall and a securing element formed in the other sidewall;
    c) the rotatable arm being of an inverted T-shaped configuration including an upper upright tube portion having a terminal end for connection to the fixed object, a lower transverse tube portion including a first end engageable with the securing element and a second end engageable within the electric wire hole for permitting the housing to be rotatable with respect to the transverse tube portion, an L-shaped channel extending from the terminal end of the upper upright tube portion through the second end of the transverse tube portion for receiving electric wires and directing same through the electric wire hole into the closed space, and means for sealing the electric wires within the L-shaped channel; and
    d) means for sealing the second end of the transverse tube portion to the peripheral edge of the electric wire hole.

2. The water-proof structure of claim 1 wherein:
    a) the means for sealingly securing the mask to the first open side of the housing includes a double-sided tape on one side of the mask and an engagement frame on an opposite side of the mask;
    b) the means for sealing the second end of the transverse tube portion to the electric wire hole includes a waterproof washer; and
    c) the means for sealing the electric wires within the L-shaped channel include a hot-melt adhesive.

3. The waterproof structure of claim 1 wherein:
    a) the housing further includes a front cover, a rear cover and a waterproof plastic ring disposed between the covers for forming a seal seam therebetween; and
    b) the rotatable arm includes a front half portion, a rear half portion, and two L-shaped waterproof plastic strips between the half portions for forming a seal seam therebetween.

4. The waterproof structure of claim 1 wherein the recess of the second side of the housing includes a rear cover plate provided with two elements, each element having a semi-circular hole formed therein for engaging the rotatable arm, and a lower portion of the rear cover plate is provided with a plurality of holes for draining water from the recess.

* * * * *